(12) United States Patent
Appel et al.

(10) Patent No.: US 6,272,336 B1
(45) Date of Patent: Aug. 7, 2001

(54) TRAFFIC-WEIGHTED CLOSED LOOP POWER DETECTION SYSTEM FOR USE WITH AN RF POWER AMPLIFIER AND METHOD OF OPERATION

(75) Inventors: Mark J. Appel, Richardson; Mitchell K. Johnson, McKinney, both of TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/222,899

(22) Filed: Dec. 30, 1998

(51) Int. Cl.[7] ...................................................... H04Q 7/20
(52) U.S. Cl. ........................ 455/423; 455/574; 455/424; 455/69; 455/126
(58) Field of Search ............................. 455/91, 115, 116, 455/126, 127, 422, 423, 424, 425, 447, 571, 572, 574, 575, 69; 330/279, 285, 136

(56) References Cited

U.S. PATENT DOCUMENTS

| | | | |
|---|---|---|---|
| 4,996,500 | * | 2/1991 | Larson et al. .......................... 330/279 |
| 5,196,806 | * | 3/1993 | Ichihara ................................ 330/137 |
| 5,507,017 | * | 4/1996 | Whitmarsh et al. ................... 455/126 |
| 5,559,471 | * | 9/1996 | Black ..................................... 330/277 |
| 5,603,106 | * | 2/1997 | Toda ...................................... 455/126 |
| 5,606,285 | * | 2/1997 | Wang et al. ........................... 330/134 |
| 5,659,893 | * | 8/1997 | Enoki et al. ........................... 455/126 |
| 5,689,815 | * | 11/1997 | Yamazaki et al. ..................... 455/69 |
| 5,764,107 | * | 6/1998 | Stone .................................... 330/279 |
| 5,809,420 | * | 9/1998 | Ichiyanagi et al. ................... 455/103 |
| 5,903,854 | * | 5/1999 | Abe et al. ............................. 455/575 |
| 6,057,732 | * | 5/2000 | Morishita ............................. 330/129 |
| 6,070,058 | * | 5/2000 | Waldroup et al. .................... 455/69 |
| 6,078,222 | * | 6/2000 | Haris et al. ........................... 330/295 |
| 6,124,758 | * | 9/2000 | Korte et al. ........................... 330/124 R |

* cited by examiner

Primary Examiner—Thanh Cong Le
Assistant Examiner—Yemane Woldetatios
(74) Attorney, Agent, or Firm—John C. Han (57) ABSTRACT

There is disclosed a power control circuit for controlling the combined effective DC bias current of a bank of parallel RF power amplifiers disposed in the transmit path of an RF transmitter. The power control circuit comprises: 1) a first signal monitor for monitoring the level of a modulated RF output signal; and 2) an amplifier bias current controller for comparing the modulated RF output signal level and a known maximum output power parameter of the active RF power amplifiers to determine if the active RF power amplifiers are operating in the linear region. If the active RF power amplifiers are operating in or near the nonlinear region, the power control circuit enables one or more inactive RF power amplifiers to increase the effective combined DC bias current and linearity of the active RF power amplifiers. Conversely, if the active RF power amplifiers are operating well within the linear region, the power control circuit may disable one or more active RF power amplifiers in order to reduce the effective combined DC bias current of the active RF power amplifiers and save power.

20 Claims, 5 Drawing Sheets

TRAFFIC-WEIGHTED CLOSED LOOP POWER DETECTION SYSTEM FOR USE WITH AN RF POWER AMPLIFIER AND METHOD OF OPERATION

TECHNICAL FIELD OF THE INVENTION

The present invention is directed, in general, to wireless communications systems and, more specifically, to a system for controlling the output power of an RF amplifier using a traffic weighted closed loop power detector.

BACKGROUND OF THE INVENTION

Reliable predictions indicate that there will be over 300 million cellular telephone customers by the year 2000. Within the United States, cellular service is offered by cellular service providers, by the regional Bell companies, and by the national long distance operators. The enhanced competition has driven the price of cellular service down to the point where it is affordable to a large segment of the population.

To maximize usage of the available bandwidth, a number of multiple access technologies have been implemented to allow more than one subscriber to communicate simultaneously with each base transceiver station (BTS) in a wireless system. These multiple access technologies include time division multiple access (TDMA), frequency division multiple access (FDMA), and code division multiple access (CDMA). These technologies assign each system subscriber to a specific traffic channel that transmits and receives subscriber voice/data signals via a selected time slot, a selected frequency, a selected unique code, or a combination thereof.

In order to further increase the number of subscribers that can be serviced in a single wireless network, frequency reuse is maximized by making individual cell sites smaller and using a greater number of cell sites to cover the same geographical area. Accordingly, the greater number of base transceiver stations increases infrastructure costs. To offset this increased cost, wireless service providers are eager to implement any innovations that may reduce equipment costs, maintenance/repair costs, and operating costs, or that may increase service quality/reliability, and the number of subscribers that the cellular system can service.

Electrical power is one of the more significant operating costs of a wireless system. Every base transceiver station has a transmitter for sending voice and data signals to mobile units (i.e., cell phones, portable computers equipped with cellular modems, and the like) and a receiver for receiving voice and data signals from the mobile units. The transmitter uses a comparatively large RF power amplifier to increase the strength of transmitted signals.

Wireless systems cannot tolerate large amounts of signal distortion and therefore require the use of RF amplifiers having good linearity characteristics across a wide range of operating conditions in order not to violate the IS 95 bandwidth requirements due to spectral spreading effects. Unfortunately, the DC-to-RF conversion efficiency for linear RF amplifiers is very low. CDMA amplifiers generally require about 8–10 dB of overhead input power ratio in order to maintain linearity in the RF waveforms.

The transmitter power amplifier consumes a constant and comparatively large amount of power, regardless of the relative strength of the output signal transmitted by the base transceiver station. For example, if the normal traffic load during the daytime requires the RF output power level to be approximately 10 watts, the DC prime power consumed by the transmitter power amplifier is approximately 80–100 watts (i.e., 8–10 dB higher). However, in the middle of the night, when the traffic load is very light, the RF output power level of the transmitter may be reduced in decrements down to, for example, about 1 watt, as power control is exercised over the RF output signal. However, the DC prime power consumed by the transmitter power amplifier will still be approximately 80–100 watts, since the operating bias points of the power amplifiers are fixed. In short, no allowance is made for reduced traffic loads.

There is therefore a need in the art for improved wireless networks that are less expensive to operate. In particular, there is a need for wireless networks that implement power control in the power amplifiers of the base station transmitters. Improved systems are needed that monitor the RF output signal level of a transmitter power amplifier and reduce the DC power level of the transmitter power amplifier according to the traffic load on the base station.

SUMMARY OF THE INVENTION

To address the above-discussed deficiencies of the prior art, it is a primary object of the present invention to provide a power control circuit for controlling an RF transmitter having a transmit path capable of receiving an input baseband signal and generating therefrom a modulated RF output signal. The power control circuit controls the combined effective DC bias current of a bank of parallel RF power amplifiers located in the transmit path of the RF transmitter. The power control circuit comprises: 1) a first signal monitor for monitoring the level of the modulated RF output signal; and 2) an amplifier bias current controller for comparing the modulated RF output signal level and the known combined maximum output power of the active RF power amplifiers to determine if the active RF power amplifiers are operating in the linear region.

If the active RF power amplifiers are operating in or near the nonlinear region, the present invention turns on one or more of the inactive RF power amplifiers to increase the power handling capability and linearity of the overall power amplifier. Conversely, if the active RF power amplifiers are operating well within the linear region, the present invention may disable one or more active RF power amplifiers in order to reduce the effective combined DC bias current of the active RF power amplifiers and save power.

In an advantageous embodiment of the present invention, the power control circuit comprises: 1) a first signal monitor capable of monitoring a level of the modulated RF output signal; and 2) an amplifier bias current controller capable of comparing the modulated RF output signal level and a known maximum output power parameter of a first RF power amplifier in the transmit path and, in response to the comparison, enabling a second RF power amplifier in parallel with the first RF power amplifier to thereby increase the power handling capability and linearity of the overall parallel amplifier. The combined DC bias current of the first RF power amplifier and the second RF power amplifier are larger than the single power amplifier and the overall linearity improves.

In one embodiment of the present invention, the amplifier bias current controller is capable of comparing the modulated RF output signal level to a known combined maximum output power parameter of a plurality of parallel RF power amplifiers in the transmit path and, in response to the comparison, disabling at least one of the plurality of parallel RF power amplifiers to thereby reduce a combined DC bias current of the plurality of parallel RF power amplifiers.

In another embodiment of the present invention, the power control circuit further comprises: 1) a first signal monitor capable of monitoring a level of the input baseband signal; and 2) a gain controller capable of comparing the input baseband signal level and the modulated RF output signal level and generating therefrom a gain control signal capable of adjusting a signal gain of the transmit path.

In still another embodiment of the present invention, the gain controller generates the gain control signal as a function of an operating temperature of the RF transmitter.

In yet another embodiment of the present invention, the gain controller generates the gain control signal as a function of an operating frequency of the RF transmitter.

In a further embodiment of the present invention, the power control circuit further comprises first scaling circuitry for scaling the modulated RF output signal level prior to the comparison of the modulated R output signal level and the known maximum output power parameter.

In a still further embodiment of the present invention, the power control circuit further comprises second scaling circuitry for scaling the input baseband signal level prior to the comparison of the input baseband signal level and the modulated RF output signal level.

In a yet further embodiment of the present invention, the amplifier bias current controller is capable of generating an alarm signal if the amplifier bias current controller is unable to increase the combined DC bias current sufficiently to maintain a linear operation of the RF transmitter.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged wireless network.

Figure 1:
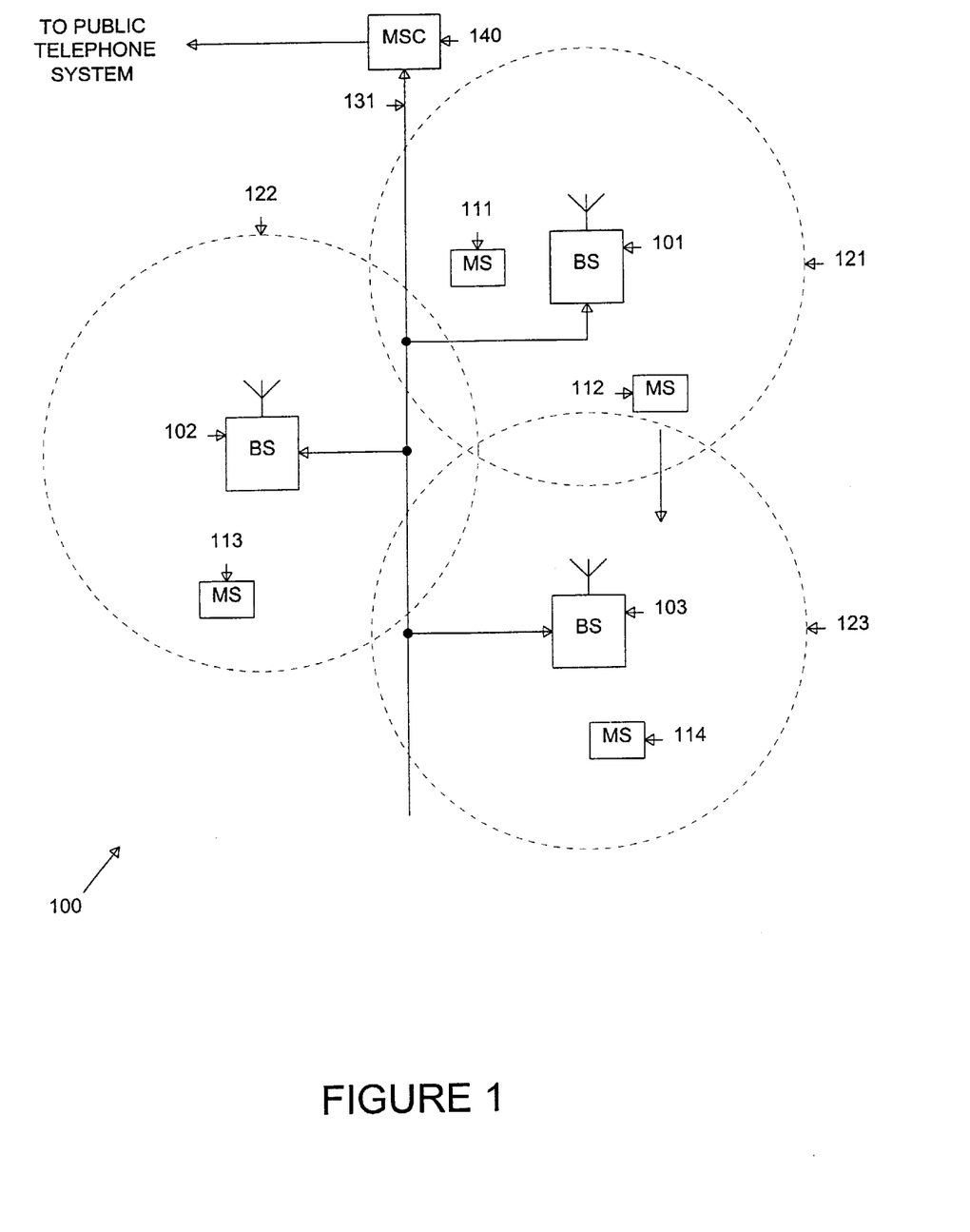
FIG. 1 illustrates an exemplary wireless network according to one embodiment of the present invention.

FIG. 1 illustrates an exemplary wireless network 100 according to one embodiment of the present invention. The wireless telephone network 100 comprises a plurality of cell sites 121–123, each containing one of the base stations, BS 101, BS 102, or BS 103. Base stations 101–103 are operable to communicate with a plurality of mobile stations (MS) 111–114. Mobile stations 111–114 may be any suitable cellular devices, including conventional cellular telephones, PCS handset devices, portable computers, metering devices, and the like.

Dotted lines show the approximate boundaries of the cells sites 121–123 in which base stations 101–103 are located. The cell sites are shown approximately circular for the purposes of illustration and explanation only. It should be clearly understood that the cell sites may have other irregular shapes, depending on the cell configuration selected and natural and man-made obstructions.

In one embodiment of the present invention, BS 101, BS 102, and BS 103 may comprise a base station controller (BSC) and a base transceiver station (BTS). Base station controllers and base transceiver stations are well known to those skilled in the art. A base station controller is a device that manages wireless communications resources, including the base transceiver station, for specified cells within a wireless communications network. A base transceiver station comprises the RF transceivers, antennas, and other electrical equipment located in each cell site. This equipment may include air conditioning units, heating units, electrical supplies, telephone line interfaces, and RF transmitters and RF receivers, as well as call processing circuitry. For the purpose of simplicity and clarity in explaining the operation of the present invention, the base transceiver station in each of cells 121, 122, and 123 and the base station controller associated with each base transceiver station are collectively represented by BS 101, BS 102 and BS 103, respectively.

BS 101, BS 102 and BS 103 transfer voice and data signals between each other and the public telephone system (not shown) via communications line 131 and mobile switching center (MSC) 140. Mobile switching center 140 is well known to those skilled in the art. Mobile switching center 140 is a switching device that provides services and coordination between the subscribers in a wireless network and external networks, such as the public telephone system. Communications line 131 may be any suitable connection means, including a T1 line, a T3 line, a fiber optic link, a network backbone connection, and the like. In some embodiments of the present invention, communications line 131 may be several different data links, where each data link couples one of BS 101, BS 102, or BS 103 to MSC 140.

In the exemplary wireless network 100, MS 111 is located in cell site 121 and is in communication with BS 101, MS 113 is located in cell site 122 and is in communication with BS 102, and MS 114 is located in cell site 12 3 and is in communication with BS 103. The MS 112 is also located in cell site 121, close to the edge of cell site 123. The direction arrow proximate MS 112 indicates the movement of MS 112 towards cell site 123. At some point, as MS 112 moves into cell site 123 and out of cell site 121, a "handoff" will occur.

As is well know, the "handoff" procedure transfers control of a call from a first cell to a second cell. For example, if MS 112 is in communication with BS 101 and senses that the signal from BS 101 is becoming unacceptably weak, MS 112 may then switch to a BS that has a stronger signal, such as the signal transmitted by BS 103. MS 112 and BS 103 establish a new communication link and a signal is sent to BS 101 and the public telephone network to transfer the on-going voice, data, or control signals through BS 103. The call is thereby seamlessly transferred from BS 101 to BS 103. An "idle" handoff is a handoff between cells of a mobile device that is communicating in the control or paging channel, rather than transmitting voice and/or data signals in the regular traffic channels.

Figure 2:
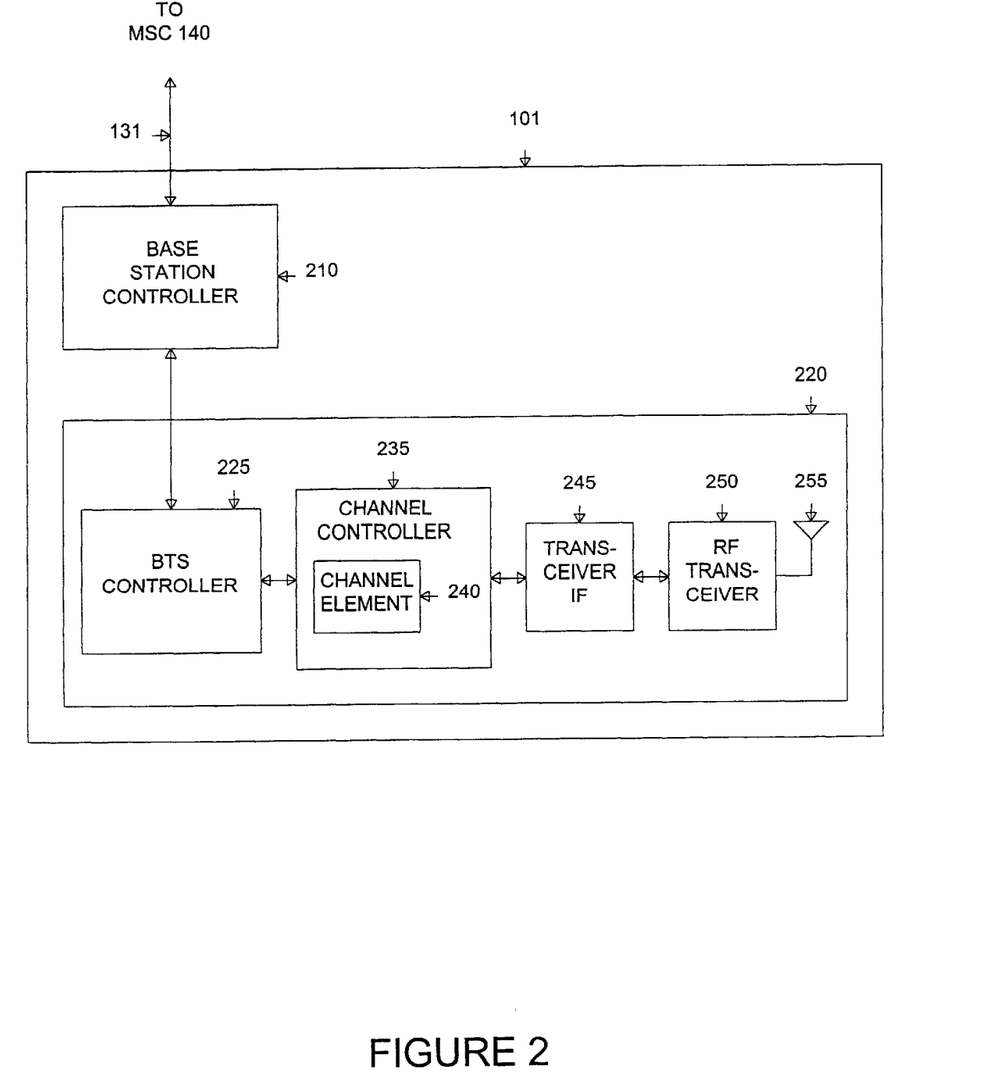
FIG. 2 illustrates in greater detail an exemplary base station in accordance with one embodiment of the present invention.

FIG. 2 illustrates in greater detail exemplary base station 101 in accordance with one embodiment of the present invention. Base station 101 comprises base station controller (BSC) 210 and base transceiver station (BTS) 220. Base station controllers and base transceiver stations were described previously in connection with FIG. 1. BSC 210 manages the resources in cell site 121, including BTS 220. BTS 220 comprises BTS controller 225, channel controller 235, which contains representative channel element 240, transceiver interface (IF) 245, RF transceiver unit 250, and antenna array 255.

BTS controller 225 comprises processing circuitry and memory capable of executing an operating program that controls the overall operation of BTS 220 and communicates with BSC 210. Under normal conditions, BTS controller 225 directs the operation of channel controller 235, which contains a number of channel elements, including channel element 240, that perform bi-directional communications in the forward channel and the reverse channel. A "forward" channel refers to outbound signals from the base station to the mobile station and a "reverse" channel refers to inbound signals from the mobile station to the base station. In an advantageous embodiment of the present invention, the channel elements operate according to a code division multiple access (CDMA) protocol with the mobile stations in cell 121. Transceiver IF 245 transfers the bi-directional channel signals between channel controller 240 and RF transceiver unit 250.

Antenna array 255 transmits forward channel signals received from RF transceiver unit 250 to mobile stations in the coverage area of BS 101. Antenna array 255 also sends to transceiver 250 reverse channel signals received from mobile stations in the coverage area of BS 101. In a preferred embodiment of the present invention, antenna array 255 is multi-sector antenna, such as a three sector antenna in which each antenna sector is responsible for transmitting and receiving in a 120° arc of coverage area. Additionally, transceiver 250 may contain an antenna selection unit to select among different antennas in antenna array 255 during both transmit and receive operations.

In an advantageous embodiment of the present invention, the transmitters in RF transceiver unit 250 comprise variable-power RF amplifiers that are capable of reducing the DC prime power consumed by base station 101. The DC power reduction occurs whenever it is determined that the power level of the RF output signal may be maintained at a lower DC prime power level in the power amplifier. This is accomplished by means of a closed-loop power detection system that reduces DC prime power to the RF power amplifier when the wireless traffic handled by the base station is at a comparatively low level.

Figure 3:
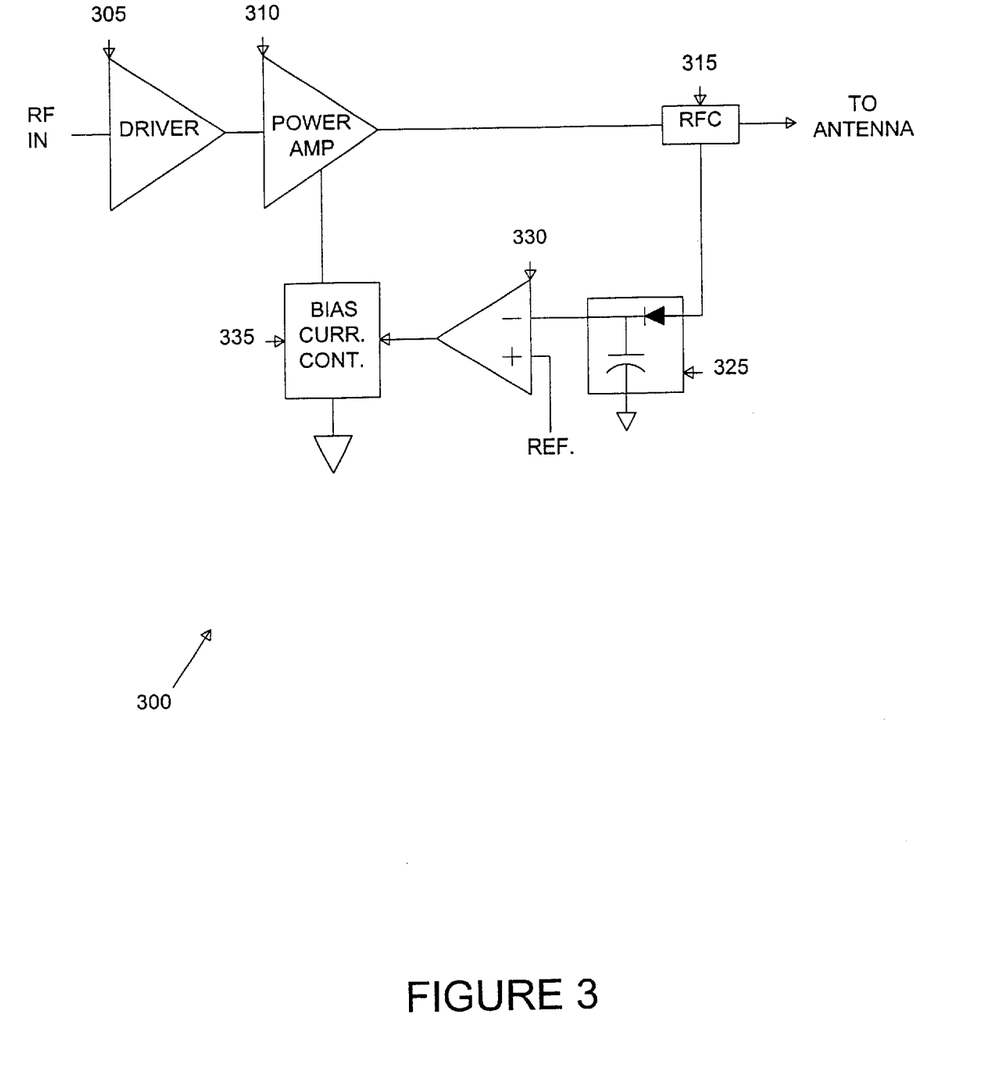
FIG. 3 illustrates a variable-power transmitter, which includes a closed-loop power detection system, for use in an exemplary RF transceiver in accordance with one embodiment of the present invention.

FIG. 3 illustrates variable-power transmitter 300, which includes a closed-loop power detection system, for use in RF transceiver 250 in accordance with one embodiment of the present invention. Variable-power transmitter 300 contains a transmit path comprising driver 305, RF power amplifier 310 and RF coupler (RFC) 315. Variable-power transmitter 300 also contains an output power detection and adjustment path, comprising power detector 325, correction amplifier 330, and bias current controller 335. The output of RFC 315 is sent to antenna array 255.

Driver 305 receives an RF input signal, RF IN, generated by an RF modulation device (not shown) in RF transceiver 250. Driver 305 conditions the RF IN signal before amplification by RF power amplifier 310. Driver 305 may apply amplification and level shifting of the RF IN signal. RF power amplifier 310 amplifies the output of driver 305 to the necessary transmission power level to drive antenna array 255. If there are comparatively few mobile stations in the coverage area of base station 101, the input amplitude level of RF IN is also comparatively low. As the number of mobile stations in the coverage area of base station 101 increases, the amplitude of the RF IN signal increases due the increased traffic in the forward channel. Correspondingly, the amplitude of the output signal of RF power amplifier 310 also increases.

As noted above, wireless systems cannot tolerate large amounts of signal distortion. It is therefore preferred that RF power amplifier 310 generate a highly linear output across a wide range of operating conditions and input signal amplitudes. When RF IN is comparatively small, RF power amplifier 310 operates well within its linear region. As the amplitude of RF IN rises, however, RF power amplifier 310 begins to operate in a non-linear manner and intermodulation distortion (IMD) is introduced in the output of power amplifier 310.

The size of the linear region in which RF power amplifier 310 operates is directly related to the amount of bias current consumed by RF power amplifier 310. If the dynamic range of RF IN is large, RF power amplifier 310 requires a comparatively large DC bias current, thereby increasing power consumption. If the DC bias current is established at a level that covers -the maximum anticipated dynamic range under heavy traffic conditions, RF power amplifier 310 will consume a comparatively large amount of power under low traffic conditions, as well.

To compensate for this, the DC bias current of RF power amplifier 310 may be adjusted according to traffic loads by means of the elements in the output power detection and adjustment path. RFC 315 monitors the RF output signal from RF power amplifier 310 and provides a copy of the RF output signal to power detector 325. The output of power detector 325 is a DC voltage proportional to the power level of the RF output signal sent to antenna array 255. Correction amplifier 330 compares the DC output signal from power detector 325 with a reference (REF) voltage to generate an output correction signal. The reference voltage may be used to establish a minimum RF output power level. The RF output power is thus guaranteed not to fall below a minimum level and bias current in RF power amplifier 310 is not adjusted until the RF output power rises above a certain output level.

Bias current controller 335 uses the output correction signal received from correction amplifier 330 to adjust the level of the DC bias current in RF power amplifier 310. As the amplitude of the RF output signal sent to antenna array 255 increases, the output correction signal generated by correction amplifier 330 also increases, thereby increasing the DC bias current in RF power amplifier 310. In one embodiment of the present invention, bias current controller 335 may increase the DC bias current incrementally as the RF output signal rises. This may be done by use of variable resistors that control current mirrors in RF power amplifier 310. In an alternate embodiment of the present invention, bias current controller 335 may increase the DC bias current in discrete steps as the RF output signal rises.

In some embodiments of the present invention, bias current controller 335 may adjust the DC bias current according to a bias current look-up table stored in memory in bias current controller 335. The bias current look-up table contains optimum bias current values that correspond to specific performance characteristics and operating conditions of RF power amplifier 310. For a given power amplifier model and a given set of temperature, frequency, and output correction signal parameters, bias current controller 335 determines the correct bias current level from the look-up table and adjusts the DC bias current in RF power amplifier 310 accordingly.

Variable-power transmitter 300 adjusts the bias point of RF power amplifier 310 in order to maintain linearity at minimal power consumption. The use of a closed correction loop in variable-power transmitter 300 also minimizes variations between devices.

Figure 4:
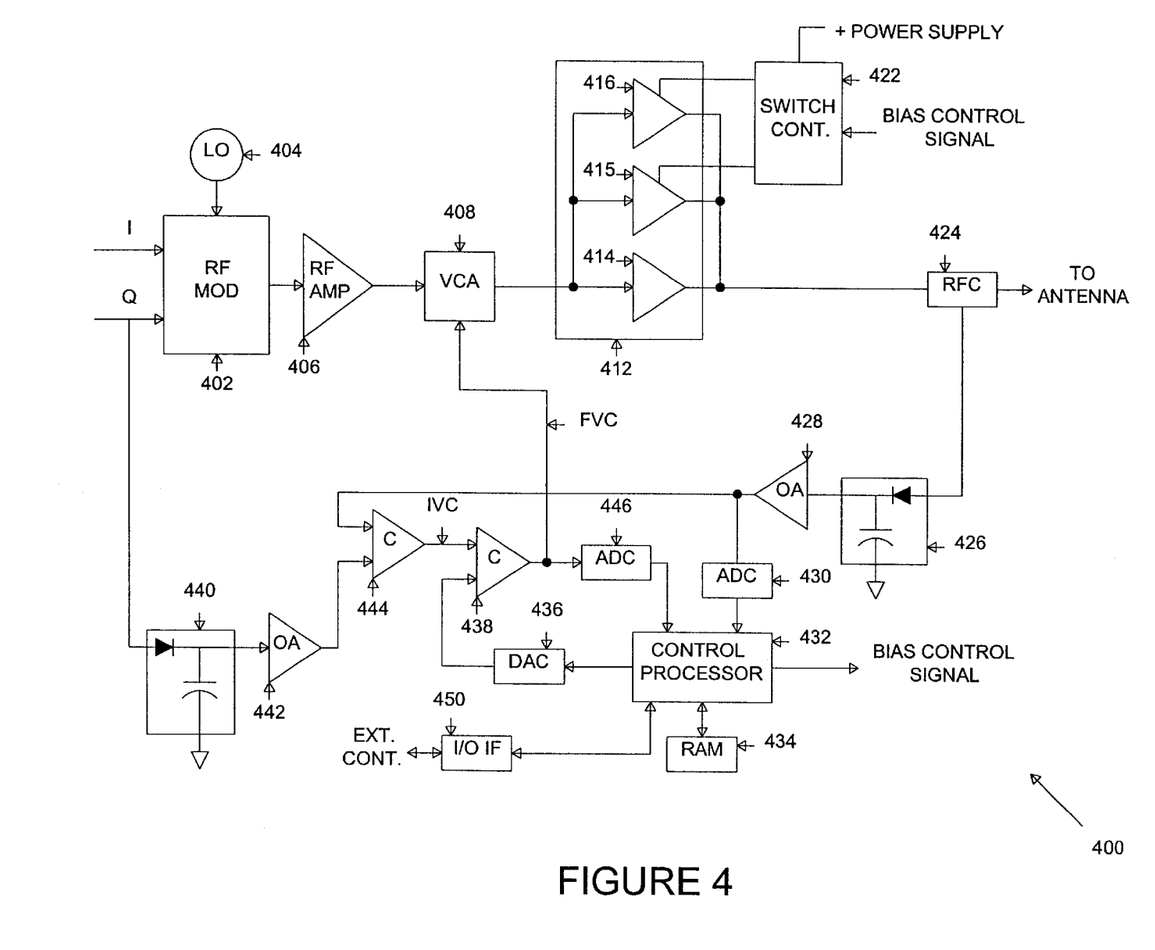
FIG. 4 illustrates an exemplary RF power detection and adjustment system for use in an RF transceiver in accordance with one embodiment of the present invention.

FIG. 4 illustrates exemplary RF power detection and adjustment system 400 for use in RF transceiver 250 in accordance with one embodiment of the present invention. RF power detection and adjustment system 400 contains a transmit path comprising RF modulator 402, RF amplifier 406, voltage controlled attenuator 408, RF power amplifier bank 412, and RF coupler (RFC) 424. RF power detection and adjustment system 400 also contains an RF output power detection and adjustment path, comprising power detectors 426 and 440, operational amplifiers 428 and 442, comparators 438 and 444, analog-to-digital converters (ADC) 430 and 446, digital-to-analog converter (DAC) 436, control processor 432 and memory 434. The RF output power detection and adjustment paths generate the signal, BIAS CONTROL, which controls switch controller 422. According to the value of BIAS CONTROL, switch controller 422 applies power to one or more of RF power amplifiers 414–416, which are arranged in parallel in RF power amplifier bank 412.

RF modulator 402 receives two baseband signals: an in-phase (I) signal and a quadrature (Q) signal. RF modulator 402 uses the I-signal and the Q-signal to perform, for example, quadrature phase shift keying (QPSK) modulation of an RF carrier signal provided by local oscillator (LO) 404. The modulated RF signal generated by RF modulator 402 is initially amplified to a selected level by RF amplifier 406. The amplified RF signal is then selectively attenuated by voltage controlled attenuator (VCA) 408, as determined by an attenuation control signal controlled by control processor 432. The attenuated RF signal is then amplified to full transmission power by one or more of RF power amplifiers 414–416 in RF power amplifier bank 412 and is finally sent to antenna array 255.

The gain of the transmit path and the DC power consumed by RE power amplifiers 414–416 are monitored and adjusted by the RF output power detection and adjustment path described above. On the input side, the Q-signal is monitored by detector 440, which rectifies the baseband Q-signal to produce a DC signal proportional to the amplitude of the Q-signal. The I-signal and Q-signal generally have the same amplitude and, as traffic levels fluctuate, the I-signal and the Q-signal rise and fall together. Therefore, in other embodiments of the present invention, the I signal may be monitored by detector 440 instead of the Q-signal. In still other embodiments of the present invention, other circuitry may be included that add, average, or otherwise combine the I-signal and the Q-signal to produce a composite signal that is monitored by detector 440. The primary function of detector 440 is to measure the amplitude of the input signal(s) for purposes of comparison with the amplitude of the output signal.

On the output side, the RF output signal sent to antenna array 255 is monitored by detector 426 via RF coupler (RFC) 424. Detector 440 rectifies the RF output signal to produce a DC signal proportional to the amplitude of the RF output signal. The input-side DC signal produced by detector 440 is based on a comparatively low power baseband signal and the output-side DC signal produced by detector 426 is based on a comparatively high power RF signal. To compensate for this, either or both DC signals may be scaled and/or level-shifted before a comparison is performed.

Operational amplifier (OA) 442 scales the input-side DC signal from detector 440 and, if necessary, introduces a discrete DC level shift. OA 428 scales the output-side DC signal from detector 426 and, if necessary, introduces a discrete DC level shift. The scaled and/or level-shifted outputs of OA 428 and OA 442 are then compared by comparator 444 to produce an initial VCA control signal (labeled "IVC" in FIG. 4). Comparator 438 then compares the initial VCA control signal to a power reference signal (described below) received from DAC 436.

Control processor 432 receives a number of different inputs that are used to control the number of RF amplifiers 414–416 connected in the transmit path and to control the value of the VCA control signal. Control processor 432 initially receives calibration data from an external controller in base station 101 via input/output interface (I/O IF) 450. Control processor 432 also receives system parameters, such as temperature, frequency and RF output power from the external controller during normal operations. This data is stored in RAM 434, which also stores the operating program that control processor 432 executes.

Control processor 432, under control of the operating program in RAM 434, monitors and controls the gain of the transmit path and the RF output power level. The scaled RF output power level at the output of OA 428 is converted to a digital value by ADC 430 and is monitored by control processor 432. The final VCA control signal (labeled "FVC" in FIG. 4) at the output of comparator 438 is converted to a digital value by ADC 446 and is monitored by control processor 432.

As the input Q-signal amplitude rises, the RF output power level also rises. Small fluctuations in the value of the input Q-signal and the RF output signal are corrected by controlling the final VCA control signal, thereby maintaining constant gain through the transmit path.

If the input Q-signal is relatively small, indicating a low level of call traffic, the RF output power is also relatively small. At low RF output power, only one of RF power amplifiers 414–416, for example RF power amplifier 414, is needed to amplify the signal received from VCA 408 while maintaining operation in a linear mode. However, as the amplitude of the input Q-signal rises, the RF output level rises to the point where RF power amplifier begins to operate in a non-linear manner and intermodulation distortion occurs in the RF output signal sent to antenna array 255.

Control processor 432 is able to detect the non-linear condition because the rise in the Q-signal amplitude is not matched by a proportional rise (i.e., a linear rise) in the RF output signal. Control processor 432 may also detect the non-linear condition based on the known operating parameters of RF power amplifier 414 and the temperature and frequency data received from the external controller via I/O IF 450. In any event, control processor 432 may correct the non-linear condition, or even anticipate and prevent the non-linear condition, by turning "ON" one or more of RF power amplifier 415 and 416 in parallel with RF power amplifier 414. Control processor 432 does this using the BIAS CONTROL signal to control switch controller 422. By selectively placing one or more of RF power amplifiers 414–416 into the transmit path, control processor 432 effectively controls the DC bias current consumed by the RF power amplifiers.

During periods of low call traffic (i.e., small Q-signal amplitude), control processor 432 reduces power consumption by using only one of RF power amplifiers 414–416 to boost the output of VCA 408 to transmission level. During periods of high call traffic (i.e., large Q-signal amplitude), control processor 432 uses two or more of RF power amplifiers 414–416 in order to increase the linear operating region and reduce intermodulation distortion in the RF output signal.

Control processor 432 controls the power reference signal at the output of DAC 436 in order to moderate the amount of change in the final VCA control signal generated by comparator 444 and comparator 438. When control processor 432 changes the number of RF power amplifiers 414–416 that are used to amplify the modulated RF signal in the transmit path, control processor 432 correspondingly adjusts the value of the power reference signal provided by DAC 436 to prevent comparators 444 and 438 from overcompensating for the sudden change in gain in the transmit path.

Additionally, control processor 432 can detect errors in the transmit path according to the change in value over time of the power reference signal generated by DAC 436. Control processor 432 modifies the power reference over time to adjust for changes in temperature and operating frequency and the selective turning ON and turning OFF of one or more of RF power amplifiers 414–416. However, control processor 432 also compares the change in the level of the power reference to pre-determined upper and lower threshold levels in order to determine if there is a faulty device in the transmit path. If the power reference signal changes too much, a component may have failed. Control processor 432 may then report the failure to an external control device via I/O IF 450.

Figure 5:
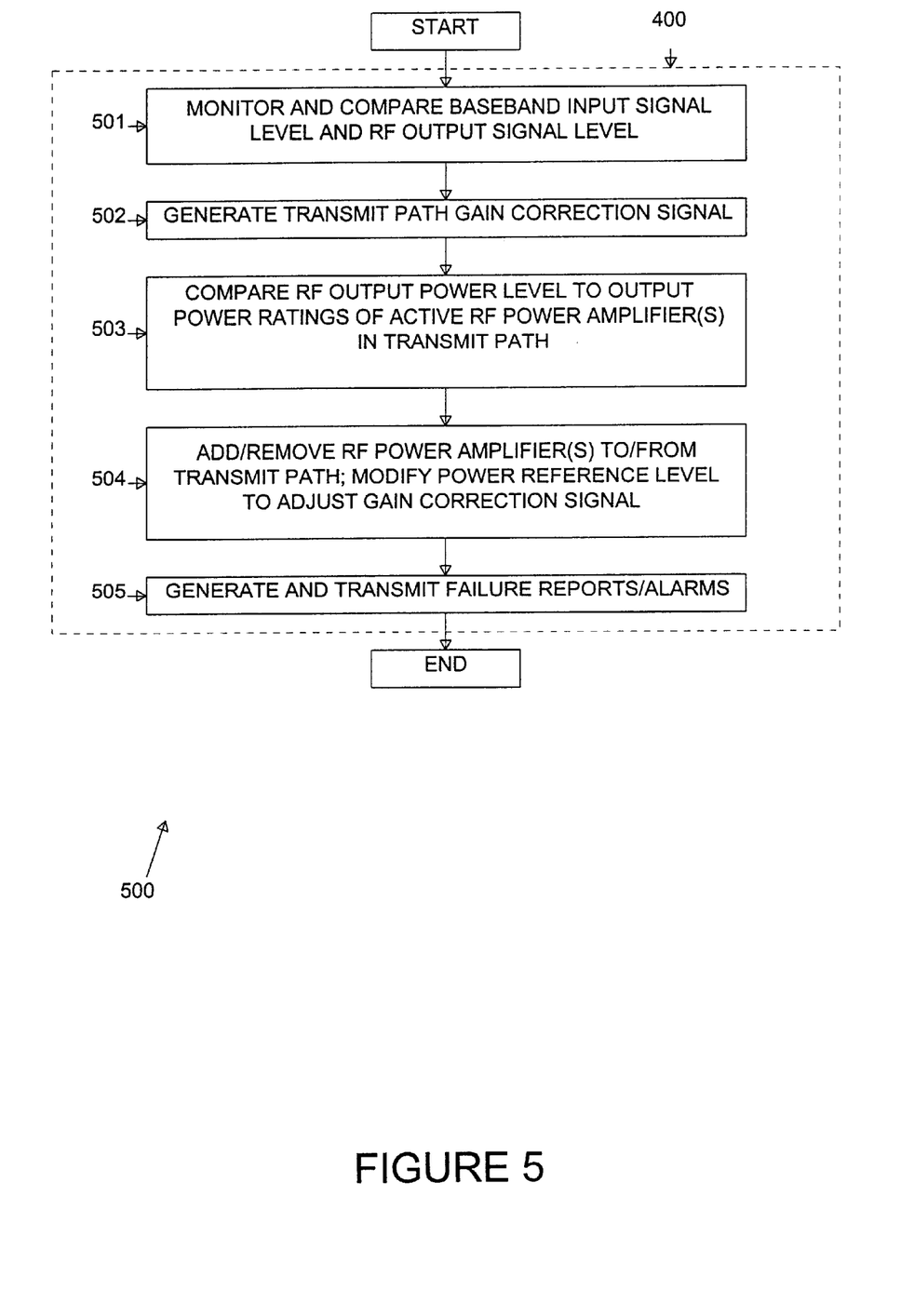
FIG. 5 illustrates a flow diagram depicting the operation of the exemplary RF power detection and adjustment system in FIG. 4 in accordance with one embodiment of the present invention.

FIG. 5 illustrates flow diagram 500, which depicts the operation of exemplary RF power detection and adjustment system 400 in accordance with one embodiment of the present invention. During routine operation, RF power detection and adjustment system 400 monitors the baseband input Q-signal level and the RF output power level and compares the two values (after appropriate scaling) to determine the gain of the transmit path (process step 501). The result of the comparison is used to generate a gain correction signal (i.e., VCA control signal) that controls VCA 408 in order to maintain constant gain in the transmit path (process step 502).

Next, control processor 432 compares the measured RF output power level to the power ratings for the one or more RF power amplifiers that are active in the transmit path (process step 503). If the RF output power level is sufficiently high to cause the active ones of RF power amplifiers 414–416 to begin to saturate and operate in a non-linear manner, control processor 432 enables additional ones of RF power amplifiers 414–416 to increase the effective dynamic range of the combined active RF power amplifiers 414–416. If the RF output power level is sufficiently low, control processor 432 may disable one or more of RF power amplifiers 414–416 in order to reduce the effective DC bias current of the combined active RF power amplifiers and thereby reduce power consumption (process step 504).

Additionally, control processor 432 may modify the power reference signal at the output of DAC 436 in order to moderate the value of the VCA control signal used to control VCA 408. Control processor 432 also adjusts the power reference signal to compensate for changes in operating temperature and/or frequency (process step 504).

Finally, control processor 432 may generate failure reports and/or alarms that are sent to an external control system. The failure reports may be generated in response to large variations in the power reference signal generated by control processor 432 and sent to DAC 436. The failure reports also may be generated in response to the inability of control processor 432 to maintain the RF power output signal in a linear mode by enabling/disabling ones of RF power amplifiers 414–416. This would be indicative of a catastrophic failure in the transmit path (process step 505).

Although the present invention has been described in detail, those skilled in the art should understand that they can make various changes, substitutions and alterations herein without departing from the spirit and scope of the invention in its broadest form.

What is claimed is:

1. For use in an RF transmitter having a transmit path capable of receiving an input baseband signal and generating therefrom a modulated RF output signal, a power control circuit for controlling said RF transmitter comprising:

a first signal monitor capable of monitoring a level of said modulated RF output signal and generating therefrom a scaled RF output signal value;

a second signal monitor capable of monitoring a level of said input baseband signal and generating therefrom a scaled baseband input signal value;

a first comparator capable of comparing said scaled RF output signal value and said scaled baseband input signal value and generating a first gain control signal;

a second comparator capable of comparing said first gain control signal and an adjustable reference signal to thereby produce a second gain control signal; and an amplifier bias current controller capable of comparing said scaled RF output signal value and a known maximum output power parameter of a first RF power amplifier in said transmit path and, in response to said comparison, enabling at least a second RF power amplifier in parallel to said first RF power amplifier to thereby increase a combined DC bias current and linearity of said first RF power amplifier and said at least a second RF power amplifier.

2. The power control circuit set forth in claim 1 wherein said amplifier bias current controller is capable of comparing said scaled RF output signal value to a known combined maximum output power parameter of a plurality of parallel RF power amplifiers in said transmit path and, in response to said comparison, disabling at least one of said plurality of parallel RF power amplifiers to thereby reduce a combined DC bias current of said plurality of parallel RF power amplifiers.

3. The power control circuit set forth in claim 1 further comprising:
  a gain controller capable of comparing said input baseband signal level and said scaled RF output signal value and generating therefrom a gain control signal capable of adjusting a signal gain of said transmit path.

4. The power control circuit set forth in claim 3 wherein said gain controller generates said gain control signal as a function of an operating temperature of said RF transmitter.

5. The power control circuit set forth in claim 3 wherein said gain controller generates said gain control signal as a function of an operating frequency of said RF transmitter.

6. The power control circuit set forth in claim 3 further comprising first scaling circuitry for scaling said modulated RF output signal level prior to said comparison of said scaled RF output signal value and said known maximum output power parameter.

7. The power control circuit set forth in claim 6 further comprising second scaling circuitry for scaling said input baseband signal level prior to said comparison of said input baseband signal level and said scaled RF output signal value.

8. The power control circuit set forth in claim 1 wherein said amplifier bias current controller is capable of generating an alarm signal if said amplifier bias current controller is unable to increase said combined DC bias current sufficiently to maintain a linear operation of said RF transmitter.

9. A wireless network capable of communicating with a plurality of mobile stations located in a coverage area of said wireless network, said wireless network comprising:
  a plurality of base stations capable of wirelessly communicating with said plurality of mobile stations, at least one of said plurality of base stations comprising an RF transmitter having a transmit path capable of receiving an input baseband signal and generating therefrom a modulated RF output signal and a power control circuit for controlling said RF transmitter, said power control circuit comprising:
    a first signal monitor capable of monitoring a level of said modulated RF output signal and generating therefrom a scaled RF output signal value;
    a second signal monitor capable of monitoring a level of said input baseband signal and generating therefrom a scaled baseband input signal value;
    a first comparator capable of comparing said scaled RF output signal value and said scaled baseband input signal value and generating a first gain control signal;
    a second comparator capable of comparing said first gain control signal and an adjustable reference signal to thereby produce a second gain control signal; and
    an amplifier bias current controller capable of comparing said modulated RF output signal level and a known maximum output power parameter of a first RF power amplifier in said transmit path and, in response to said comparison, enabling at least a second RF power amplifier in parallel to said first RF power amplifier to thereby increase a combined DC bias current and linearity of said first RF power amplifier and said at least a second RF power amplifier.

10. The wireless network set forth in claim 9 wherein said amplifier bias current controller is capable of comparing said scaled RF output signal value to a known combined maximum output power parameter of a plurality of parallel RF power amplifiers in said transmit path and, in response to said comparison, disabling at least one of said plurality of parallel RF power amplifiers to thereby reduce a combined DC bias current of said plurality of parallel RF power amplifiers.

11. The wireless network set forth in claim 9 wherein said power control circuit further comprises:
  a first signal monitor capable of monitoring a level of said input baseband signal; and
  a gain controller capable of comparing said input baseband signal level and said scaled RF output signal value and generating therefrom a gain control signal capable of adjusting a signal gain of said transmit path.

12. The wireless network set forth in claim 11 wherein said gain controller generates said gain control signal as a function of an operating temperature of said RF transmitter.

13. The wireless network set forth in claim 11 wherein said gain controller generates said gain control signal as a function of an operating frequency of said RF transmitter.

14. The wireless network set forth in claim 11 wherein said power control circuit further comprises first scaling circuitry for scaling said scaled RF output signal value prior to said comparison of said modulated RF output signal level and said known maximum output power parameter.

15. The wireless network set forth in claim 14 wherein said power control circuit further comprises second scaling circuitry for scaling said input baseband signal level prior to said comparison of said input baseband signal level and s said scaled RF output signal value.

16. The wireless network set forth in claim 9 wherein said amplifier bias current controller is capable of generating an alarm signal if said amplifier bias current controller is unable to increase said combined DC bias current sufficiently to maintain a linear operation of said RF transmitter.

17. For use in a wireless network comprising a plurality of base stations capable of communicating with a plurality of mobile stations located in a coverage area of the wireless network, a method of operating an RF transmitter in one of the plurality of base stations, the RF transmitter having a transmit path capable of receiving an input baseband signal and generating therefrom a modulated RF output signal, the method comprising the steps of:
  monitoring a level of the modulated RF output signal and generating therefrom a scaled RF output signal value;
  monitoring a level of said input baseband signal and generating therefrom a scaled baseband input signal value;
  comparing said scaled RF output signal value and said scaled baseband input signal value and generating a first gain control signal;
  comparing said first gain control signal and an adjustable reference signal to thereby produce a second gain control signal;

comparing the modulated RF output signal level and a known maximum output power parameter of a first RF power amplifier in the transmit path; and in response to the comparison of the modulated RF output signal level and said power parameter of a first RF power amplifier in the transmit path, enabling at least a second RF power amplifier in parallel to the first RF power amplifier to thereby increase a combined DC bias current and linearity of the first RF power amplifier and the second RF power amplifier.

18. The method set forth in claim 17 comprising the further steps of:

comparing said scaled RF output signal value to a known combined maximum output power parameter of a plurality of parallel RF power amplifiers in the transmit path; and in response to the comparison, disabling at least one of the plurality of parallel RF power amplifiers to thereby reduce a combined DC bias current of the plurality of parallel RF power amplifiers.

19. The method set forth in claim 17 comprising the further step of:

comparing the input baseband signal level and the modulated RF output signal level; and generating therefrom a gain control signal capable of adjusting a signal gain of the transmit path.

20. The method set forth in claim 19 wherein the gain control signal adjusts the signal gain of the transmit path as a function of at least one of an operating temperature of the RF transmitter and an operating frequency of the RF transmitter.

* * * * *

UNITED STATES PATENT AND TRADEMARK OFFICE
CERTIFICATE OF CORRECTION

| | |
|---|---|
| PATENT NO. : 6,272,336 B1 | Page 1 of 1 |
| DATED : August 7, 2001 | |
| INVENTOR(S) : Mark J. Appel and Mitchell K. Johnson | |

It is certified that error appears in the above-identified patent and that said Letters Patent is hereby corrected as shown below:

<u>Column 3,</u>
Line 17, delete "R" and insert -- RF --.

<u>Column 6,</u>
Line 62, delete "-the" and substitute -- the --.

<u>Column 8,</u>
Line 14, delete "RE" and insert -- RF --.

Signed and Sealed this

Sixteenth Day of April, 2002

*Attest:*

JAMES E. ROGAN
*Attesting Officer*     *Director of the United States Patent and Trademark Office*